(12) United States Patent
Allenspach et al.

(10) Patent No.: US 7,336,515 B2
(45) Date of Patent: Feb. 26, 2008

(54) METHOD OF MANIPULATING A QUANTUM SYSTEM COMPRISING A MAGNETIC MOMENT

(75) Inventors: Rolf Allenspach, Adliswil (CH); Gian R. Salis, Pfaeffikon (CH)

(73) Assignee: International Business Machines Corporation, Armonk, NY (US)

( * ) Notice: Subject to any disclaimer, the term of this patent is extended or adjusted under 35 U.S.C. 154(b) by 271 days.

(21) Appl. No.: 10/854,390

(22) Filed: May 26, 2004

(65) Prior Publication Data

US 2005/0276149 A1 Dec. 15, 2005

(51) Int. Cl.
*G11C 19/08* (2006.01)
(52) U.S. Cl. .............................. 365/33; 365/66; 365/74
(58) Field of Classification Search .................. 365/33, 365/74, 66
See application file for complete search history.

(56) References Cited

U.S. PATENT DOCUMENTS

| | | | |
|---|---|---|---|
| 5,747,180 A * | 5/1998 | Miller et al. ................. 977/762 |
| 6,987,302 B1 * | 1/2006 | Chen et al. .................. 257/368 |
| 2003/0076649 A1 * | 4/2003 | Speakman ................... 361/524 |
| 2003/0207766 A1 * | 11/2003 | Esteve et al. ................. 257/31 |
| 2004/0012388 A1 * | 1/2004 | Pedersen ................. 324/244.1 |
| 2004/0078421 A1 * | 4/2004 | Routt ......................... 709/201 |
| 2004/0151014 A1 * | 8/2004 | Speakman ................... 365/49 |
| 2005/0117617 A1 * | 6/2005 | Yoshida et al. ............... 372/44 |

* cited by examiner

*Primary Examiner*—Thong Q. Le
(74) *Attorney, Agent, or Firm*—Michael J. Buchenhorner; Ido Tuchman

(57) ABSTRACT

A method for manipulating a quantum system comprises at least one mobile charge carrier with a magnetic moment. The method comprises the steps or acts of applying magnetic field to the charge carrier. The magnetic is spatially non-homogeneous. The method also comprises bringing the charge carrier into an oscillatory movement along a path. The magnetic field depends on the position of the charge carrier on said path. The oscillatory movement may be caused by electrostatic interaction with gate electrodes. Due to this approach, thus, in a magnetic moment resonance process the conventional oscillating magnetic field is replaced by an oscillating electric field which is locally transformed into a magnetic field by the Coulomb interaction that displaces the charge carrier wave function within an inhomogeneous magnetic field or in and out of a magnetic field.

20 Claims, 2 Drawing Sheets

METHOD OF MANIPULATING A QUANTUM SYSTEM COMPRISING A MAGNETIC MOMENT

CROSS-REFERENCE TO RELATED APPLICATIONS

Not Applicable

STATEMENT REGARDING FEDERALLY SPONSORED-RESEARCH OR DEVELOPMENT

Not Applicable

INCORPORATION BY REFERENCE OF MATERIAL SUBMITTED ON A COMPACT DISC

Not Applicable

FIELD OF THE INVENTION

The invention relates to the manipulation of a magnetic moment such as an electron spin magnetic moment. Such manipulation can be used for logic or data elements in quantum computing and quantum storage.

BACKGROUND OF THE INVENTION

In a quantum computer or a quantum storage, a bit is usually a two-level quantum system (quantum bit or "qubit"). The two spin states of a single electron or an other charge carrier have been suggested as quantum bits. However, such quantum bits require the manipulation of an individual electron spin. To this end, local application of magnetic fields to confined electrons is necessary. This requires excellent control of the local magnetic field, since neighboring spins should not be affected by the field.

A very good localization of an applied field results if the field is applied by a magnetic scanning tip. However, this greatly limits the speed with which spins may be manipulated.

Other suggestions for manipulating individual spins include the use of magnetic resonance techniques. In one such approach, a whole device comprising a plurality of quantum bits is flooded in a homogeneous oscillating field slightly off resonance. The individual spin to be manipulated is then displaced into a region where the interactions with the environment are such that the oscillating frequency of the homogenous field is the resonance frequency of the spin. This approach, however, requires the application of high frequency (for electron spins usually in the GHz region) AC magnetic fields. This is technically rather difficult.

Therefore there is a need for a method of manipulating a quantum system with a magnetic moment which overcomes drawbacks of prior art methods and which especially does not require a high frequency AC magnetic field to be applied.

There is also a need for a logic element or a storage element which does not require the application of a high frequency AC magnetic field for a gate operation or writing process.

SUMMARY OF THE INVENTION

According to the invention, a method for manipulating a quantum system comprises at least one mobile charge carrier with a magnetic moment. The method also comprises the steps or acts of applying a magnetic field to the charge carrier and of bringing the charge carrier into an oscillatory movement along a path, wherein said magnetic field depends on the position on the path. The magnetic field is non-homogenous.

The oscillatory movement may be caused by electrostatic interaction with gate electrodes.

Due to this approach, thus, the conventional, globally oscillating magnetic field used in a typical magnetic resonance configuration is replaced by an oscillating electric field which locally acts as a magnetic field by the Coulomb interaction that displaces the charge carrier wave function within an inhomogeneous magnetic field or in and out of a magnetic field.

The magnetic field may be a stray field caused by a locally confined ferromagnetic substance.

The charge carrier may be an electron or an electron vacancy (a hole) carrying an excess spin in a quantum dot. As an alternative, the charge carrier may be a charge carrier provided by a dopant in a semiconductor matrix.

In particular, therefore, a method for manipulating a quantum dot having an excess electron spin comprises steps or acts of applying a static magnetic field to the quantum dot, the strength of the magnetic field depending on the position, and of applying an AC electric field to the quantum dot and thereby causing an oscillatory movement of the excess spin via the motion of the charge so that the strength of the magnetic field acting on it has an oscillatory time dependence.

BRIEF DESCRIPTION OF THE DRAWINGS

Other features as well as further advantages of the invention will become apparent from the following description of embodiments. The description refers to schematic drawings, where FIG. 1, very schematically shows a principle of the invention.

DESCRIPTION OF THE PREFERRED EMBODIMENT

In this specification, a "Quantum system", as opposed to a classical physical system is a physical system where the quantum nature becomes relevant. Especially, in a quantum system a magnetic moment may only assume discrete values with respect to a certain pre-defined direction.

Some examples discussed herein include a quantum dot or a system made up of a dopant (such as a Phosphorus donor in a silicon matrix) and the charge carrier provided by it (such as the excess electron of the donor) in a semiconductor matrix. Other examples of quantum systems are thinkable.

A "quantum dot" is a physical system where charge carriers are confined in all three dimensions such that the variables of motion of the charge carriers can only assume a few discrete states (i.e. they are quantized). Typically, such quantum dots contain only a small number of charge carriers. In addition, the spin of an excess charge carrier can only assume a few discrete states, or be in a coherent superposition of these states. Such systems currently are primarily realized in specifically designed semiconductor heterostructures or semiconductor nanocrystals. The typical size of a semiconductor quantum dot is between 1 nm and a few 100 nm in any direction.

A charge carrier is assumed to be "mobile" if its state allows a spatial displacement. Charge carriers in this context are considered to be mobile even if they can only be displaced within a small confined region, as can for example electrons of quantum dots. Yet, a confinement may—as an alternative to the conventional quantum dot confinement—be achieved by any interaction, for example molecular interactions etc. Further, the invention includes manipulation of charge carriers that are not permanently confined at all.

Figure 1:
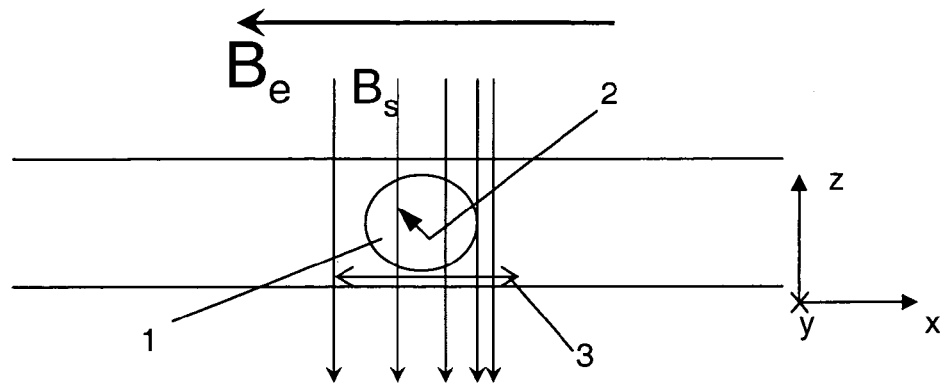

FIG. 1 shows a quantum system 1 comprising an electron or a plurality of electrons and comprising an excess electron spin bringing about a magnetic moment 2. A magnetic moment in a quantum system along a particular direction may only assume discrete values. If the magnetic moment is the spin magnetic moment of an electron, the magnetic moment along a certain pre-defined direction z is denoted to be $$m_z = \mp \frac{1}{2} g \mu_B$$

where $\mu_B$ is the Bohr magneton being a physical constant and where the value $+\frac{1}{2}$ or $-\frac{1}{2}$ is the electron spin. The value "g" accounts for relativistic effects as well as, in a phenomenological way, for the interaction with the semiconductor environment.

The electrons in the shown example are freely movable along a plane (x,y) but confined in the direction perpendicular thereto (z). A magnetic field is applied to the quantum system. The field is spatially inhomogeneous and thus depends on the position. In the shown example, the magnetic field consists of two contributions: An essentially homogeneous and constant external magnetic field $B_e$, also referred to as applied field, and an inhomogeneous magnetic field $B_s$, also referred to as tipping field. The applied field is preferably much stronger than the tipping field, for example by at least an order of magnitude. The applied field here is parallel to the x direction, whereas the tipping field points in the $-z$ direction and is dependent on the x position.

In this and the following examples, there is made a distinction between the essentially homogeneous and constant applied field and the inhomogeneous tipping field. It is however important to know that this is pure notation introduced for practical reasons, since in preferred embodiments applied field and tipping field are generated in a different manner. In principle, any two magnetic fields may be described as a resulting magnetic field being the vector sum of the two magnetic fields. In fact, the only really fundamental requirement is that the total magnetic field—it may have any direction—spatially varies in direction or magnitude at the place of the quantum system.

According to the invention, the electrons are subject to an oscillatory movement. Due to the spatial variation of the magnetic field, an effective oscillating magnetic field therefore acts on the excess electron spin, the apparent magnetic field oscillating frequency corresponding to the frequency of the oscillatory movement. If the electrons' x positions varies with time t as $x(t)=x_0 \cos(\omega t)$, then the tipping field strength at the places of the electron is $B_S(t)=B_0+B_1 \cos(\omega t)$. Such an oscillatory time dependence of the magnetic field strength may in principle be caused by an oscillatory movement along any direction along which the magnetic field is not constant. However, preferably a direction parallel to or approximately parallel to the direction with largest magnetic field variation is chosen.

The applied field $B_e$ may for example have a strength between 0.1 T and 10 T. The oscillating frequency may then be chosen so that it corresponds to the Zeeman resonance frequency of the magnetic moment in the applied field. In other words, the frequency is approximately the Zeeman splitting $g\mu_B B_e$ of the magnetic moment in the applied field $B_e$ divided by Planck's constant $\hbar$. If this resonance condition is fulfilled, the x component of the magnetic moment will oscillate, so that after a well-defined time, the magnetic moment will either be in a different state than before oscillation starts or will be again in the same state, depending on the time duration. This effect is used to purposefully manipulate the magnetic moment. The period of the magnetic moment oscillation depends on the amplitude $B_1$ of the oscillation of the effective magnetic field (thus on the difference between the tipping fields at extremal positions of the charge carrier on its oscillation path divided by 2).

In a general magnetic field, the resonance condition is fulfilled if the oscillation frequency corresponds to the Zeeman resonance frequency of the magnetic moment in an average of the magnetic field, the average being taken along the path. In many cases, however, the tipping field is much smaller than the applied field, and its contribution may be neglected when calculating the Zeeman resonance frequency.

In resonance, the magnetic moment oscillates the faster the larger the amplitude of the effective magnetic field oscillation. Since in quantum computing and quantum storage the switching time (the time for reversing one bit) is crucial, a large effective magnetic field oscillation amplitude is desired. This may be achieved by a large field gradient and by letting the charge carrier travel a comparably long path within the inhomogeneous field.

In order to reverse one bit, the charge carrier has to oscillate for a time corresponding to the switching time or an odd multiple thereof. An 'oscillation pulse' duration $t_0$ may thus fulfill $$t_O = (2n-1) * \underbrace{\left( \frac{h}{2g\mu_B B_1} \right)}_{\text{switching\_time}}$$

with $n = 1, 2, \ldots$

A numerical example: In resonance, for a g factor of 2, the switching time is 18 ns if the oscillation amplitude equals $B_1$=1 mT. More generally, it is proportional to the inverse of the oscillation amplitude $B_1$.

Figure 2:
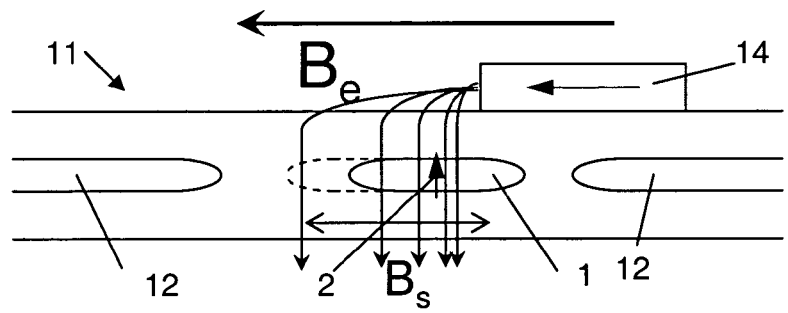
FIG. 2, depicts an illustration of a first embodiment of the invention.

There are several ways of applying a tipping field, and there are several ways of causing an oscillatory movement. According to an especially advantageous embodiment of the invention, the magnetic field is a stray field of a ferromagnetic structure. Also, preferably the oscillatory movement is caused by an interaction with electrostatic gates which are supplied by an AC voltage during an 'oscillation pulse' duration. FIG. 2 shows a first embodiment. A quantum system 1, namely a quantum dot, comprising at least one mobile electron is formed in a layered system.

Methods of generating, by means of a semiconductor heterostructure, an electron gas movable in a plane but confined in a direction perpendicular thereto are known in the art and will not be described or discussed in detail here. Also methods of further confining such an electron gas within a small region in the plane and thus producing a quantum dot are well-known. Quantum dots may comprise different amounts of charge carriers. Quantum dots comprising as little as less than a dozen electrons or even only one electron have been generated.

In the shown embodiment, the quantum dot is generated in a semiconductor heterostructure 11 with in-plane gates 12, which are for example negatively charged and in this way confine the quantum dot laterally. A ferromagnetic dot 14 produces a magnetic stray field $B_s$. For reasons of clarity, only field lines in one direction are shown. An applied magnetic field $B_e$ is also shown in the drawing.

An AC applied voltage is superimposed on the negative voltage acting upon the gates 12. This causes an oscillatory movement of the quantum dot (i.e. of the wave functions of the electron(s) of the dot). Since a stray magnetic field of a small dot is spatially inhomogeneous, this movement causes an effective oscillating magnetic field to act upon the electron(s). The amplitude $B_1$ of this oscillation depends on the field gradient. Micromagnetic numerical simulations show that field gradients of at least 0.4 mT/nm can be achieved: For example, a 10 nm magnetic Co layer (assumed magnetization $1.4*10^6$ A/m) patterned into a 400 nm*400 nm large island may produce a perpendicular stray field of 45 mT at a vertical (z) distance of 50 nm from the magnetic layer. At 50 nm distance in lateral (x/y) direction from the edge of the magnetic layer—still at 50 nm vertical distance—the field gradient reaches a maximum of 0.4 mT/nm.

Figure 3:
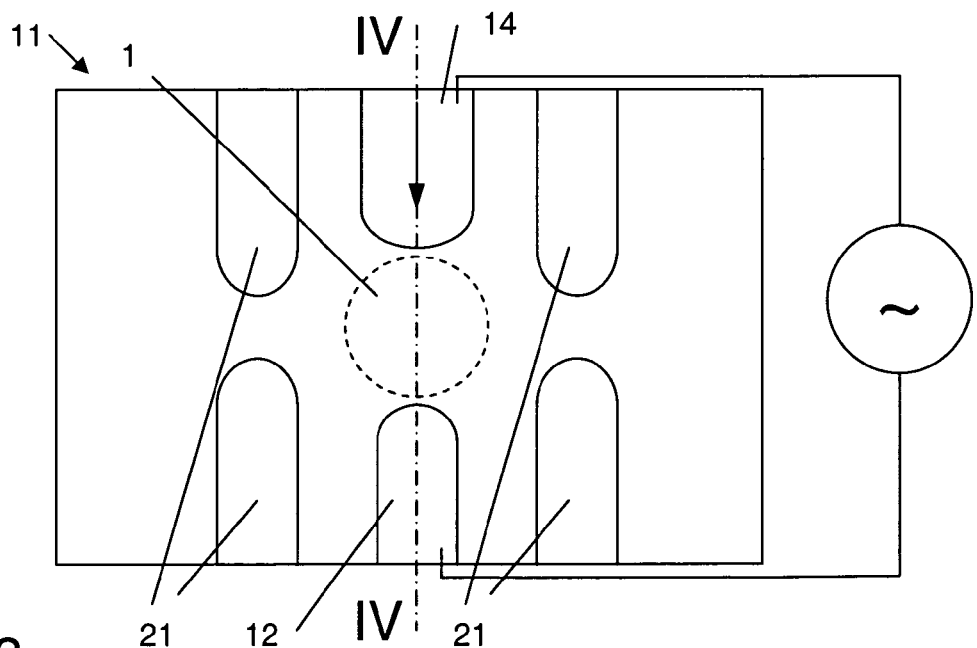
FIG. 3 shows a top view of a second embodiment of the invention.
Figure 4:
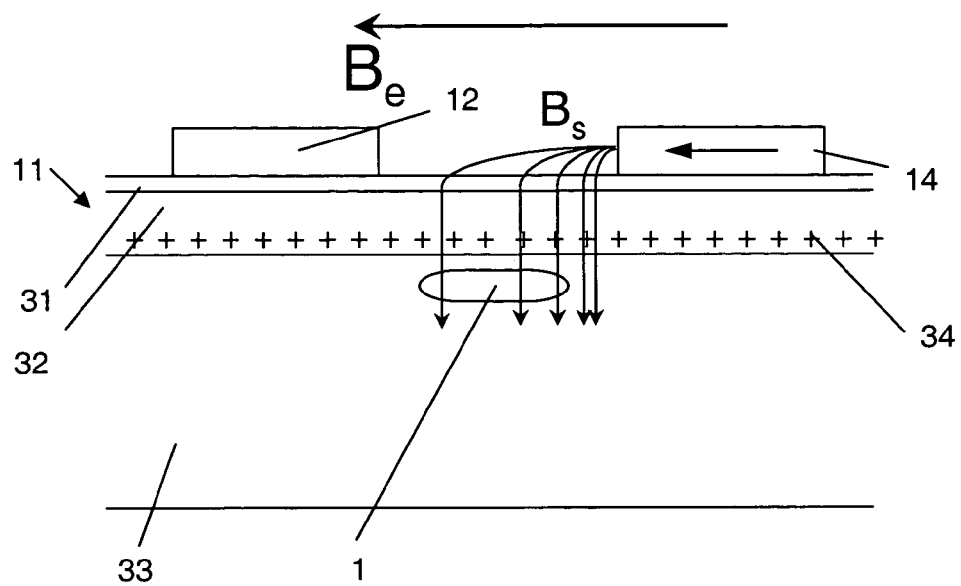
FIG. 4 shows a cross section along the line IV-IV in FIG. 3.

FIGS. 3 and 4 display a further embodiment of the invention. A semiconductor heterostructure 11 is provided with six gate electrodes 12, 14, 21 which interact to confine a quantum dot 1. The heterostructure comprises, on a GaAs substrate 33, a layer 32 of AlGaAs. On the AlGaAs layer, a thin GaAs film 31 is provided, on which the electrodes are arranged. Near the interface between the GaAs substrate 33 and AlGaAs layer 32, the AlGaAs layer comprises a layer of n-dopants 34. Due to semiconductor interface effects, the extra electrons of the dopants tend to move to an interface region in the GaAs substrate 33, leaving behind positively charged donor rests. If the electrodes 12, 14, 21 are charged negatively, electrons thus form a quantum dot 1 vertically confined to the interface region and laterally confined by the electrodes 12, 14, 21.

While in the shown embodiment five of the six electrodes are non-ferromagnetic (for example made of gold, silver, copper or an other non-ferromagnetic conductor), one electrode 14 is of a ferromagnetic material (such as cobalt, iron, nickel, a ferromagnetic alloy, ferromagnetic semiconductor or ferromagnetic material comprising a rare earth ferrimagnet etc.) and produces a stray field $B_s$ as in the example above. By applying an AC electric voltage between the ferromagnetic electrode 14 and a further electrode 12, the quantum dot can be brought into oscillatory movement. Again, preferably the AC frequency corresponds to the resonance frequency of the electron spin in an applied magnetic field $B_e$.

A skilled person will know many other systems in which quantum dots may be created. For example, an even better vertical confinement may be achieved if a quantum well is defined between two interfaces instead of only at one interface. Also, a large variety of semiconductor materials and of dopants may be used, including the standard material systems based on Si, SiGe, GaAs, AlAs, Ge, InP, ZnSe etc, but also more exotic systems including organic semiconductors etc. Also, there are various ways to fabricate small gate electrodes including lithographic, shadow masking techniques, or scanning probe based lithography techniques.

The ferromagnetic dot does not have to also serve as a gate electrode but may alternatively be a separate element which may or may not be electrically insulated from all electrodes.

Figure 5:
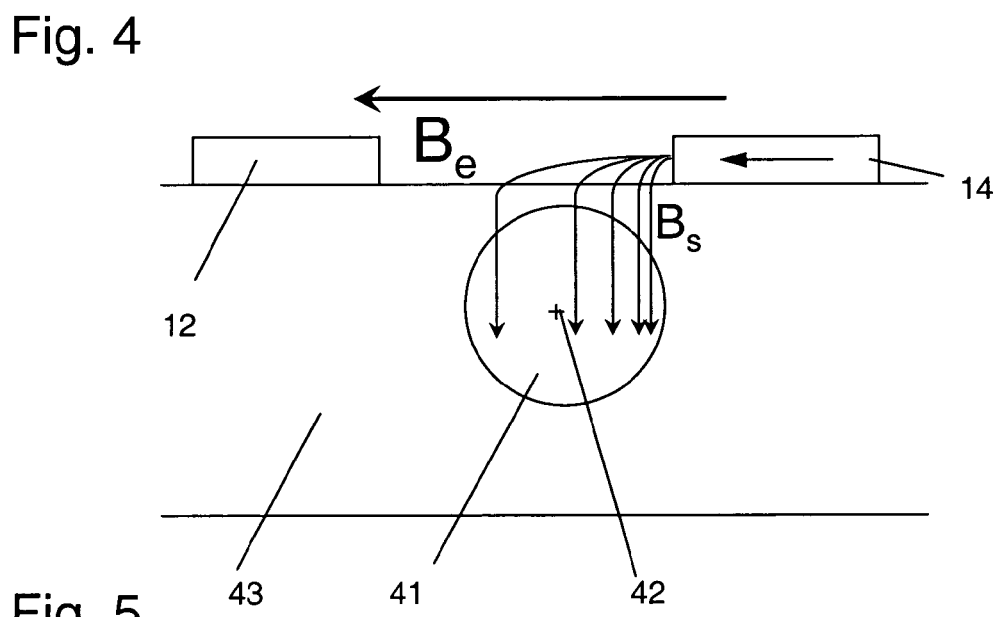
FIG. 5 shows yet another embodiment of the invention.

An example of a further quantum system is schematically shown in FIG. 5. A Si substrate 43 comprises an isolated phosphorous donor 42, the extra electron 41 of which has a wave function that is spread over a substantial volume around the donor.

The extra electron may again be subject to oscillatory movement by applying an AC voltage between two electrodes 12, 14. In the shown embodiment, one of the electrodes also serves as the ferromagnetic dot 14 producing the inhomogeneous stray field. The tipping process in this system is analogous to the process outlined above referring to FIGS. 1 to 4.

All embodiments may either be a logic element for a quantum computing device or a storage element of a quantum storage system. Other applications for deliberate manipulations of, for example, electron spins may be envisaged, as used in spin-based electronics or spin-based optical switching and opto-electronics.

Figure 6:
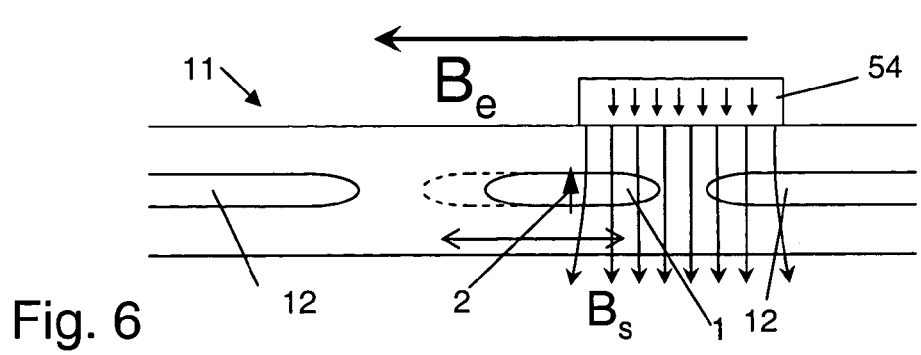
FIG. 6 depicts an embodiment of the invention where the stray field is produced by an out-of-plane magnetized ferromagnetic dot.

In all described embodiments, the electrons may be replaced by holes. Instead of causing an oscillatory movement by an AC voltage, mechanical oscillation may in principle be applied. Also, the geometrical configuration may be changed in many ways, including the arrangement of electrodes, ferromagnetic dot and charge carrier with respect to each other. The ferromagnetic dot may be magnetized in an arbitrary way as long as its stray field exhibits a substantial gradient. This includes an out-of-plane magnetization, as is illustrated in FIG. 6, where the reference numerals 1, 2, 11, 12 refer to the same elements as in FIG. 2. A ferromagnetic dot 54 is magnetized out-of-plane. The stray field $B_s$ thus produced exhibits, at a low vertical (z−) distance from the dot, a large field gradient close to the dot's lateral borders. This may be used for producing an effective oscillating field in the manner described above with reference to a stray field produced by an in-plane magnetized ferromagnetic dot.

Instead of a stray field, any other kind of magnetic field may be used, for example an effective exchange field, or a magnetic field generated by an electric current flowing through a conducting wire. Yet another alternative would be the hyperfine effective field generated by a nucleus or a matrix of nuclei and acting on electrons nearby.

The resonance condition explained above is not a prerequisite for the process according to the invention but, though the switching time constant is smaller if it is fulfilled. In general, the magnetic moments of a device comprising several quantum systems of the described kind will evolve coherently in an externally applied magnetic field, and the excitation of a certain magnetic moment in the way described above will change the status of that particular magnetic moment compared to the others. For a writing process on one magnetic moment it is sufficient to produce a difference in the evolution of this said magnetic moment compared to all other magnetic moments. In other words, it is not necessary to keep the other magnetic moments at zero magnetic field.

The oscillatory electric field applied to the gate electrodes does not necessarily have to be a sinusoidal ('harmonic') AC electric field but may have any oscillatory time dependence. It may especially have a triangular or rectangular time dependence or comprise a sequence of single pulses equally spaced in time.

Although in the above described embodiments it is assumed that the quantum system comprises a spin-½-charge carrier, the magnetic moment referred to in this description and claims may be a magnetic moment of a correlated or non-correlated system comprising two or more electrons or holes. Thus, the quantum system may comprise an effective spin of more than ½. Further, the magnetic moment may be an orbital magnetic moment or a combination of spin/orbital magnetic moments. Also, the magnetic moment may also be a nuclear magnetic moment or a combination of nuclear and electron/hole magnetic moments.

Various other embodiments may be envisaged without departing from the scope and spirit of the invention.

What is claimed is:

1. A method for manipulating a quantum system comprising at least one mobile charge carrier with a magnetic moment, the method comprising:
   applying a magnetic field to the at least one mobile charge carrier, said magnetic field being spatially inhomogeneous; and
   bringing the at least one mobile charge carrier into an oscillatory movement along a path, wherein said magnetic field depends on the position of the at least one charge carrier on said path.

2. The method as claimed in claim 1, further comprising selecting an oscillation frequency of said oscillatory movement such as to correspond to a Zeeman resonance frequency of said mobile charge carrier in an average of said magnetic field along said path.

3. The method as claimed in claim 1, wherein the quantum system is a quantum dot comprising one of at least one electron and at least one hole as charge carrier.

4. The method as claimed in claim 1, wherein the magnetic field is static, wherein a static magnetic field is not time dependent.

5. The method as claimed in claim 1, wherein the magnetic field comprises a component being a stray field produced by a locally confined ferromagnetic substance.

6. The method as claimed in claim 5, wherein said ferromagnetic substance is provided in a flat ferromagnetic element which is magnetized in-plane.

7. The method as claimed in claim 5, wherein said ferromagnetic substance is provided in a flat ferromagnetic element which is magnetized out-of-plane.

8. The method as claimed in claim 1, wherein the charge carrier is brought into oscillatory movement by application of an oscillating electric field.

9. The method as claimed in claim 1, wherein the magnetic field comprises a first field component and a second field component, the second field component being a stray field produced by a laterally confined ferromagnetic substance, the first field component being an external applied field and being larger than the second field component.

10. The method as claimed in claim 8, wherein an oscillation frequency of the oscillating electric field corresponds to a Zeeman resonance frequency of the magnetic moment in the first field component.

11. The method as claimed in claim 8, wherein the oscillating electric field is applied by means of electrostatic gates.

12. The method of claim 1 further comprising selecting the magnetic moment such as to be an excess spin magnetic moment of the at least one charge carrier.

13. A logic element or storage element comprising:
   a quantum system comprising at least one mobile charge carrier with a magnetic moment;
   a ferromagnetic dot producing a stray field which spatially varies in magnitude or direction at the place of the quantum system, and
   electrodes between which the quantum system is arranged and with which an oscillatory electric field is applicable to the quantum system.

14. A logic element as claimed in claim 13, wherein the quantum system is a quantum dot.

15. The logic element as claimed in claim 13, wherein the quantum system comprises a dopant in a semiconductor matrix and a charge carrier provided by said dopant.

16. The method for manipulating a quantum dot having an excess electron spin, the method comprising the steps of
   applying a static magnetic stray field to the quantum dot, the strength of the magnetic stray field depending on the position, and
   applying an oscillatory electric field to the quantum dot and thereby causing an oscillatory movement of the excess spin, so that the strength of the total magnetic field acting on it has an oscillatory time dependence.

17. The method as claimed in claim 16, wherein next to the magnetic stray field also a static magnetic field is applied, the static field being stronger than the magnetic stray field, and wherein an oscillation frequency of said oscillatory electric field corresponds to a Zeeman resonance frequency of the electron spin in the static magnetic field.

18. A logic element or storage element comprising:
   a quantum dot wherein the quantum dot includes a dopant in a semiconductor matrix and a charge carrier provide by said dopant, and wherein the quantum dot comprises an excess electron spin;
   a ferromagnetic dot producing a magnetic stray field at the place of the quantum dot, the strength of the magnetic stray field depending on the position; and
   gate electrodes for applying an oscillatory electric field to the quantum dot and thereby causing an oscillatory movement of the excess spin.

19. The method of claim 12, further comprising providing a semiconductor matrix comprising a dopant.

20. The method of claim 19, further comprising the dopant providing at least one mobile charge carrier with a magnetic moment.

* * * * *